(12) United States Patent
Albrecht

(10) Patent No.: US 9,354,255 B2
(45) Date of Patent: May 31, 2016

(54) OUTPUT STAGE MODULE FOR A POWER AMPLIFIER DEVICE

(75) Inventor: Adam Albrecht, Nürnberg (DE)

(73) Assignee: Siemens Aktiengesellschaft, München (DE)

( * ) Notice: Subject to any disclaimer, the term of this patent is extended or adjusted under 35 U.S.C. 154(b) by 1076 days.

(21) Appl. No.: 13/429,200

(22) Filed: Mar. 23, 2012

(65) Prior Publication Data

US 2013/0076359 A1    Mar. 28, 2013

(30) Foreign Application Priority Data

Mar. 24, 2011   (DE) .......................... 10 2011 006 061

(51) Int. Cl.
| | | |
|---|---|---|
| *G01V 3/00* | (2006.01) | |
| *G01R 1/30* | (2006.01) | |
| *G01R 33/34* | (2006.01) | |
| *G01R 33/36* | (2006.01) | |
| *G01R 21/00* | (2006.01) | |

(52) U.S. Cl.
CPC ........ *G01R 1/30* (2013.01); *G01R 21/00* (2013.01); *G01R 33/3403* (2013.01); *G01R 33/3614* (2013.01); *G01R 33/34007* (2013.01)

(58) Field of Classification Search
CPC .................................................. G01R 33/3403
USPC .................................................. 324/322, 318
See application file for complete search history.

(56) References Cited

U.S. PATENT DOCUMENTS

| | | | | |
|---|---|---|---|---|
| 4,739,443 | A * | 4/1988 | Singhdeo ....................... | 361/689 |
| 5,477,188 | A * | 12/1995 | Chawla et al. ................. | 330/269 |
| 5,537,080 | A * | 7/1996 | Chawla et al. ................. | 330/266 |
| 6,452,798 | B1 * | 9/2002 | Smith et al. .................... | 361/699 |
| 2004/0151925 | A1 | 8/2004 | Inoue et al. | |

(Continued)

FOREIGN PATENT DOCUMENTS

| | | |
|---|---|---|
| CN | 1282142 A | 1/2001 |
| CN | 1524826 A | 9/2004 |

(Continued)

OTHER PUBLICATIONS

German Office Action dated Nov. 21, 2011 for corresponding German Patent Application No. DE 10 2011 006 061.8 with English Translation.

(Continued)

*Primary Examiner* — Louis Arana
(74) *Attorney, Agent, or Firm* — Lempia Summerfield Katz LLC

(57) ABSTRACT

An output stage module for a power amplifier device (e.g., for a power amplifier device of a transmit unit of a magnetic resonance device) includes a housing and a carrier that is arranged within the housing. The carrier is made of a non-electrically-conducting, thermally-conducting material with low electrical losses (e.g., a ceramic carrier). At least two transistor dies are arranged on the carrier. At least one transistor, in each case, is assigned to a phase of a symmetrical input signal. In and/or on the carrier, a first conductor structure connecting (e.g., inductively) a drain output of the at least two transistor dies to an output signal and to second conductor structures each conducting an input signal to at least one gate input of the at least two transistor dies are provided. At least one cooling channel routed adjacent to at least one transistor die of the at least two transistor dies is provided.

25 Claims, 3 Drawing Sheets

(56) References Cited

U.S. PATENT DOCUMENTS

2006/0054810 A1   3/2006   Grasslin et al.
2009/0041466 A1   2/2009   Patel et al.
2015/0168514 A1*  6/2015   Albrecht ................. 324/322

FOREIGN PATENT DOCUMENTS

| CN | 1735814 A     | 2/2006  |
| CN | 101577526 A   | 11/2009 |
| DE | 602 12 957 T2 | 1/2007  |

OTHER PUBLICATIONS

Chinese Office action for related Chinese Application No. 201210081314.X, dated Feb. 3, 2016, with English Translation.

Wang, Baoshan et al. "Development Trend of Microelectronic Packaging Technology" Electro-Mechanical Engineering, 1985.

Zhenjun Wang et al.: "Siemens Magnetic Resonance Radio Frequency System Principle and Common," Progress of Biological Medicine Engineering in China, http://www.cnki.net, relevant to claim No. 1-15.

* cited by examiner

OUTPUT STAGE MODULE FOR A POWER AMPLIFIER DEVICE

This application claims the benefit of DE 10 2011 006 061.8, filed on Mar. 24, 2011.

BACKGROUND

The present embodiments relate to an output stage module for a power amplifier device, such as a power amplifier for a magnetic resonance device.

Magnetic resonance devices are used primarily for clinical applications. As a part of the imaging process, nuclear spins of an object under examination aligned via a transmit antenna are excited, and image data is received by a receive antenna. High power is needed to operate the transmit antenna. The high power is provided by a power amplifier device. The power amplifier device may be built into a transmit unit of the magnetic resonance device.

In such cases, a power amplifier device, in which as many components and/or conductor structures as possible are implemented on a common printed circuit board structure, is produced. The power amplifier device has a number of power modules (e.g., four power modules) that may generate an output power of 5-8 kW, so that, in combination, a power of, for example, 30 kW may be achieved. The power modules, which ultimately represent an output stage, may also be considered as output stage modules. A push-pull output that operates in accordance with the push-pull principle with symmetrical input signals may be used.

Since the system operates at extremely high power, transistors used in the output stage modules need to be cooled. In known power amplifier devices, this is realized by a copper plate being arranged below the printed circuit board. Coolant channels running to positions to be cooled are routed through the copper plate. The printed circuit board is furnished with breakthroughs at locations provided for the transistors, so that the housed transistor units provided are inserted at the breakthroughs. The housed transistor units may be brought into direct contact with the copper plate provided below the printed circuit board.

The transistor units having their own housing used for this purpose have a plurality of disadvantages. The transistor units are attached by reflow soldering (re-melt soldering) and may only withstand three reflow cycles. The first assembly occupies two of the cycles so that only one reflow cycle remains for repair. The replacement of the damaged transistor may adversely affect the solder quality of the other installed transistors. This technical problem stems from the overall construction of the printed circuit board of the power amplifier device. The desired compact structure demands a flangeless transistor unit that is to be soldered to the copper plate, which is connected to the printed circuit board. In addition, this solution is expensive not only in relation to the manufacturing of the transistor unit with the housing, but also in relation to the printed circuit board arranged on the copper plate. It is extremely complicated to replace a damaged transistor. A loss of power is risked during the repair processes.

SUMMARY AND DESCRIPTION

The present embodiments may obviate one or more of the drawbacks or limitations in the related art. For example, construction of output stage modules that is simple-to-assemble and allows an adequate cooling of the transistors is provided.

In one embodiment, the output stage module includes a housing and a carrier. The carrier is arranged within the housing and is made of a non-electrically conductive, thermally-conductive material with low electrical losses (e.g., a ceramic carrier). At least two transistor dies are arranged on the carrier. At least one transistor is assigned, in each case, to a phase of a symmetrical input signal. In and/or on the carrier, a first conductor structure connecting the drain outputs of the transistor dies inductively to an output signal and two conductor structures guiding an input signal to at least one gate input of the transistor dies, in each case, are provided. Within the carrier, at least one cooling channel is routed adjacent to at least one transistor die.

The entire output stage module is realized as one constructional unit that is disposed in a housing. In this case, instead of a usual printed circuit board, a carrier made of a non-electrically conductive material with lower electrical losses (e.g., a ceramic carrier) is used. A cooling channel is integrated into the carrier structure without any problems. Such carriers (e.g., ceramic carriers with cooling options for different dies) have been proposed in the prior art in other applications. In such cases, the carrier is supported (e.g., centrally) within the housing and carries the necessary electronics of the output stage module (e.g., the conductor structures and the transistor dies). With these types of carriers, multilayer conductor structures may be realized. The carrier also acts as the printed circuit board, which because of particular characteristics, also allows a cooling channel to be provided. The cooling channel may be routed directly past the transistor die.

The module also has input and output connections that are coupled to the corresponding conductor structures. At least two coolant connections for feeding and draining of coolant into the cooling channel or out of the cooling channel are provided.

The output stage module may operate in push-pull mode (e.g., as a push-pull output stage, in which, in each case, an equal quantity of transistors is assigned one phase of asymmetrical input signal). Thus, a first group of transistors (which may also include just one transistor) receives a 0° signal, while the other group of transistors (which may also include only one transistor) receives a phase-opposed 180° signal. The drain outputs of the transistor dies are combined again in the first conductor structure so that, by inductive coupling, for example, the output signal may be generated in a known manner. The first conductor structure thus acts as a transmitter.

The present embodiments thus describe a compact constructional unit able to be manufactured separately. The compact constructional unit may advantageously be employed in power amplifier devices (e.g., power amplifier devices of magnetic resonance devices). The output stage module and the entire power amplifier device may be realized with a lower weight, since no copper plate, to which transistor units are soldered, is needed. The material costs of the output stage module are low, and suitable technologies are already available for manufacturing. The use of constructional units provides that there is no need for a repair, since the output stage module may be easily replaced by a new output stage module. The design of the present embodiments is thus configured for modularity.

The output stage module is the basic unit that may also be used in a cascaded configuration in order to achieve the desired output power. For example, three output stage modules may be connected to each other in order to ultimately obtain three times the power.

Where on the conductor structures the operating voltage ultimately engages depends on the precise type of the output stage realized. It is normal with push-pull output stages to couple the operating voltage to the drain output of the transistors. The source inputs of the transistor constructional units may be grounded. This is explained in greater detail below.

In one embodiment, the second conductor structures may be embodied as a balun conductor structure. The two conductor structures generate signals phase-opposed by 180° as input signals for the transistor dies. Thus, if a symmetrical signal with two phase-opposed components has not been provided by other components of a power amplifier device, a balun (e.g., based on inductive coupling) may also be integrated into the overall construction of the output stage module (e.g., into and/or onto the carrier). This further advantageously promotes the integration and the compact embodiment in the output stage module realized as one constructional unit. A second conductor structure embodied in this way may also be referred to as a "gate balun structure." Similarly, the first conductor structure may be referred to as a "drain combiner structure."

In another embodiment, at least one conductor structure (e.g., an inductively-acting conductor structure) is embodied as a multilayer conductor structure. At least one layer bearing a conductor track is provided within the carrier. Known techniques for such carriers functioning as printed circuit boards allow, even, for example, with a ceramic carrier, multilayer conductor structures to be provided. A compact design of the output stage module is further promoted through the use of the multilayer conductor structures. For example, for the first conductor structure on an outer surface of the carrier, at least one conductor surface connected to the drain outputs of the transistor may be provided. The at least one conductor surface interacts with conductor tracks running in the opposite direction in layers within the carrier, in which the currents forming the output signal are induced. Two layers located within the carrier are provided with conductive surfaces (e.g., conductor tracks). Balun conductor structures may be realized in a number of layers in a fundamentally known manner.

In an advantageous embodiment, at least one pair of connections is provided for connecting an external capacitor serving to set the resonant frequency of a conductor loop of the conductor structure, for inductively-acting conductor structures. The conductor loops are not already closed within the constructional unit by a capacitor defining a specific resonant frequency. This is done by capacitors to be connected externally (e.g., freely-selectable capacitors). One embodiment of the output stage module is able to be used for a plurality of operating frequencies, since the output stage module may be tuned by external components. In this way, the area of use of such an output stage module is expanded so that the output stage module may be manufactured in larger volumes and thereby at lower cost.

In this context, it may be advantageous, with second conductor structures embodied as an inductive balun conductor structure and a central coupling-in of a control signal, for two pairs of connections to be provided opposite one another for connecting two capacitors. If, for example, the rectangular circuit plane through the carrier is considered, the connection for the control signal may be provided centrally at one boundary, while connections for the capacitors may be provided at the adjacent edges to the side of the control signal connection in each case. In this way, a greater symmetry of the arrangement is produced.

In one embodiment, at least one source conductor structure coupled to ground may be provided on an outer side of the carrier. The source inputs of the transistor dies are connected to the at least one source conductor structure (e.g., wire-bonded, and/or a conductor surface connected to at least one drain output of a transistor die may have a connection for operating voltage at a central point and be connected via a capacitor to ground). Thus, a source conductor structure lying at mass potential may further be provided. The source conductor structure advantageously at least partly lies on the outer side of the carrier adjacent to the transistor dies. The operating voltage may be coupled at a central point of a conductor surface connected to the drain outputs of at least one transistor die of the first conductor structure. A similar embodiment may be provided in amplifier concepts, in which the operating voltage is controlled via the source input of a transistor.

In another embodiment, with source inputs of the transistor dies provided on one side of a first conductor surface of the first conductor structure connected to a drain output, a bridge-type conductor element of the source conductor structure (e.g., a bridge consisting of Kovar) may be provided for contacting the source inputs. Transistor dies include a number of inputs, since a low-impedance coupling is required at source. With such a bridge-type conductor element that is routed via the conductor surface of the first conductor structure, source inputs of the transistor may be connected to ground to both sides.

In one embodiment, the carrier may be equipped on both sides with transistor dies (e.g., to have an identical outer structure on both sides). In this way, a circuit structure with transistor dies is provided on both sides (e.g., symmetrically), so that the output stage module may be produced as a more compact design. Particular advantages are produced when a multi-layer line structure based on inductive interaction is used. The portions of the line structure realized within the carrier may be used from both sides. For example, with an inductively-acting structure deriving the output signal from the signals of the drain outputs of the transistor dies, with conductor surfaces connected to the drain outputs of the transistor dies as a "primary winding," a common "secondary winding" able to be used for both sides of the carrier may be created. The common secondary winding may lie in two layers inside the carrier. With this embodiment, a symmetry of the entire arrangement is produced. The two-sided equipping on the same resonator ("secondary winding") provides that an ultra-compact design is produced.

In one embodiment, the transistor dies may be soldered with their drain output to a part of the conductor surface forming the first conductor structure of the carrier and wire bonded with their gate input to the corresponding second conductor structure. If a source conductor structure is present in this case, the transistor die may also be wire bonded to the source conductor structure. The carrier thus gives the option, by providing suitable conductor surfaces on the outer side of the carrier, of soldering the transistor dies with their drain output directly onto the carrier, without wire bonding being used. Thus, a direct bonding for the drain output is used so that only the gate and source inputs are to be wire bonded to the corresponding conductor structure.

In one embodiment, eight transistor dies may be provided on at least one side of the carrier (e.g., on both sides of the carrier), with two transistors of one phase being coupled in each case via a conductor surface of the carrier to two transistors of the other phase. In this way, a compact and symmetrical structure that integrates eight transistors and the additional inductive interaction conductor structures into a single constructional unit in an extremely compact manner is produced.

In a further advantageous embodiment, the inner side of the housing may include a conductor surface acting as a ground surface (e.g., a metallization), and the carrier may be embodied without a ground surface. The housing may, for example, consist of plastic. Simple grounding may thus be provided, since the metalized housing may be used as a grounding surface. Thus, a grounding plane does not have to be provided in the carrier in a complicated manner. This simplifies the already simple structure of the output stage module resulting from the plane arrangement of the components even further. If, for example, a source conductor structure is provided as ground on the outer side of the carrier, the source conductor structure may be easily connected to a metallization of the housing (e.g., by wire bonding).

In one embodiment, the at least one cooling channel may correspond in width and position to that of the adjacent transistor dies. If, for example, a two-sided component placement is provided, the cooling channel may be provided between transistor dies arranged on opposing sides of the carrier and may correspond essentially to the width of the transistor dies. Thus, two transistor constructional units are cooled at the same time in one location.

The carrier may be embodied as a ceramic carrier, since ceramics represent low cost materials with desired properties (e.g., high thermal conductivity, stable electrical characteristics (low losses), and the absence of electrical conductivity). In one embodiment, the ceramic carrier may consist of aluminum oxide ceramic (Alumina) and/or aluminum nitride ceramic.

In one embodiment, a power amplifier device (e.g., for a transmit unit of a magnetic resonance device) including at least one output stage module (e.g., a push-pull output stage module) in accordance with the present embodiments is provided. The disclosure relating to the output stage may be transferred similarly to the power amplifier device. The power amplifier device may thus be manufactured at lower cost, may be more compact and may be easy to repair. Power amplifier devices may also be realized more easily, since a copper plate is no longer required. In the amplifier device, the output stage modules may be cascaded in a simple manner in order to achieve a desired overall power (output power) of the power amplifier.

The present embodiments also relate to a magnetic resonance device including at least one transmit unit with one embodiment of a power amplifier device. The disclosure provided above may also be transferred to the magnetic resonance device. It is in the area of magnetic resonance devices that compact and easily constructed devices are able to be used to advantage and thus profitably.

DETAILED DESCRIPTION OF THE DRAWINGS

Figure 1:
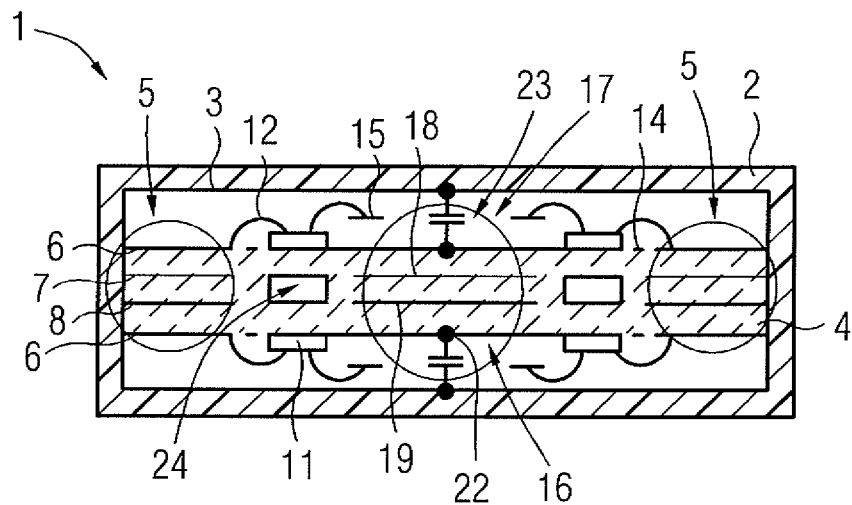
FIG. 1 shows a cross-section through one embodiment of an output stage module.
Figure 2:
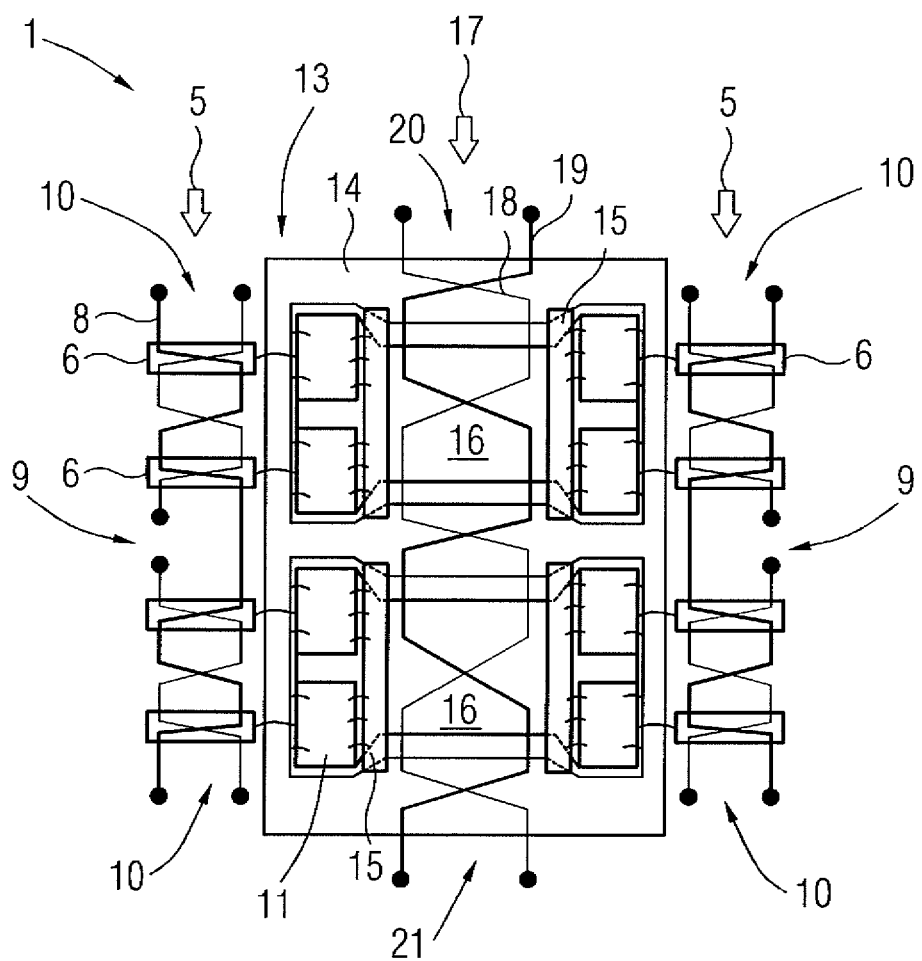
FIG. 2 shows the circuit structure and line structures of one embodiment of the output stage module.

FIG. 1 shows a cross-section through one embodiment of an output stage module 1 realized as a constructional unit, while FIG. 2 shows the circuit structure with the different conductor structures (e.g., the embodiment relating to the course of the conductors) in greater detail.

The output stage module 1 includes a housing 2 made of plastic. The housing 2 is provided on an inner side with a metallic coating 3 that serves both as a screen and also as a ground surface. Supported in the housing 2 is a carrier 4 made of ceramics (e.g., an aluminum oxide ceramic that, in a compact form, carries the circuit structure shown in FIG. 2).

The structures that are realized on or in the carrier 4 are constructed essentially symmetrically. Thus, initially, two second conductor structures 5 (e.g., balun structures) that generate exactly phase-opposed input signals (e.g., shifted by 180° on the two sides) are provided. These phase-opposed input signals are provided, since the output stage module 1 is embodied as a push-pull output stage.

As can best be seen from FIG. 2, the balun realized by the second conductor structure 5 operates inductively in that conductor surfaces 6 applied to an outer side of the carrier 4 interact as a "secondary winding" with conductor tracks 7, 8 realized in two inner layers of the carrier 4 in order to generate the desired input signal from a signal input via a pair of connections 9.

The conductor tracks 7, 8 of the multilayer second conductor structure 5 have further external pairs of connections 10 on both sides that are used to connect an external capacitor, via which a resonant circuit of the two conductor tracks 7, 8 with the appropriate inherent frequency is formed. This provides that the output stage module 1 is able to be tuned by external components.

If a sufficiently good symmetrical signal is already available as a control signal, the embodiment of the second conductor structures 5 as balun conductor structures may also be dispensed with.

The desired input signal is thus present at the conductor surfaces 6 of the second conductor structures 5 and is fed from the conductor surfaces 6 from gate connections of sixteen transistor dies 11 equipped on the carrier 4. This occurs, as is shown from the figures, via wire bonding using a wire 12. Eight transistor dies 11 in each case are assigned to the phase of the symmetrical input signal. As shown in FIG. 1, to obtain the most compact structure of the carrier 4, components are equipped on both sides. Because of the specific multilayer embodiment, the inner layers of the different conductor structures may be used on both outer surfaces. In the case of the second conductor structures 5, as a consequence, the conductor tracks 7, 8 may be used by conductor surfaces 6 applied to both sides of the outer surfaces of the carrier 4.

On the opposing outer surfaces of the carrier 4, a source conductor structure 13 that, as well as a conductor surface 14 applied to the surface of the carrier 4, includes four Kovar bridges 15 on each side, is provided in each case. Bridge conductor surfaces 16 are presented in greater detail below. The five source inputs of the transistor components 11 are connected by wire bonding to the source conductor structure (e.g., connected via a connection to the metallization 3 not shown in greater detail), which is grounded.

A lower side of the transistor components 11 forms a drain output of the transistor component 11, so that for the transistor components 11, the drain output is directly connected by the application of the transistor components 11 to the conductor surface 16 to said surface. The conductor surface 16 forms part of a first conductor structure 17 that is designed to combine the signals of the transistor dies 11 present at the drain output into the common, amplified output signal in an inductive manner. For this purpose, the first conductor structure 17 is also embodied as a multilayer structure. Between the conductor surfaces 16 arranged on the outer surfaces of the carrier 4, conductor tracks 18, 19 lie in two further layers that form a "secondary winding" for the conductor tracks 16 acting as the "primary winding." A current is induced whenever a current flows through the conductor surface 16. As is the case with the two conductor structures 5, the conductor tracks 18, 19 not only have a pair of connections 20 for tapping off the output signal, but also have a further pair of connections 21, to which an external capacitor for tuning to the correct operating frequency of the output stage module 1 may be connected. The operating voltage for the output stage module 1 is provided at a center 22 of the conductor surfaces. This is done via a coupling capacitor 23 that is connected on the other side to ground (thus, to the metallization 3).

Since very high power is to be generated with the output stage module 1, cooling of the transistor dies 11 is provided. Cooling channels 24 are provided for this purpose within the carrier 4. The cooling channels 24 are provided between two transistor dies 11 located opposite one another with the same width as the transistor die 11. Since the ceramic of the carrier 4 is not electrically-conductive and is provided with stable electrical properties in relation to power losses, but is also thermally-conducting, an effective cooling is possible in this manner. To feed and drain coolant in the cooling channels 24, corresponding connections to the output stage module I (not shown here in any greater detail), thus coolant inlets and coolant outlets, are provided.

This produces an extremely compact structure that may be manufactured from low-cost materials. The output stage module 1 is also lightweight and may easily be exchanged in a power amplifier device during use.

Instead of the pair of connections 10 and 21, capacitors may also be installed within the output stage module 1. The output stage module 1 is then set to a specific operating frequency.

Figure 3:
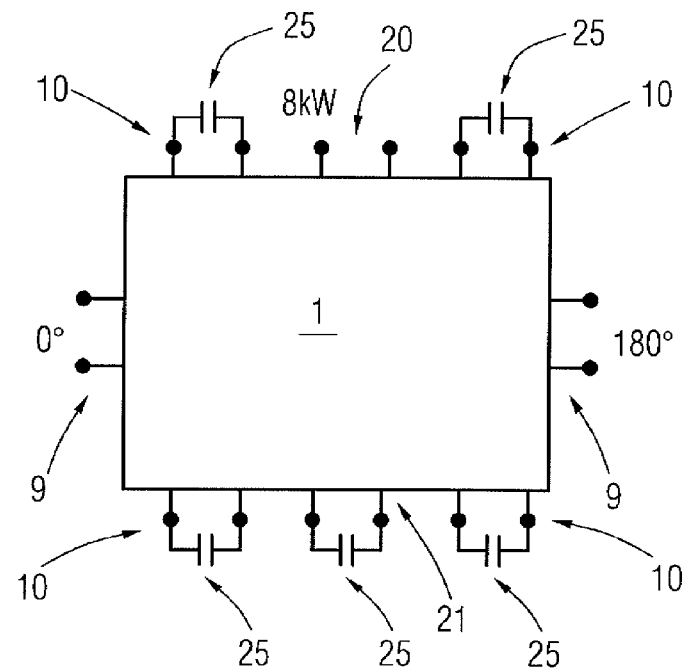
FIG. 3 shows the use of one embodiment of an individual output stage module.

FIG. 3 shows the output stage module I with the pairs of connections 9, 10, 20 and 21. At the connections 10 and 21, external capacitors 25 are provided for tuning the output stage module I to a specific frequency. A symmetrical control signal with the phase 0° is applied with a corresponding frequency to the left side in FIG. 3 to the connections 9. On the right side, a symmetrical control signal with the phase 180° likewise is applied to the pair of connections 9. A symmetrical output signal is obtained at the output with a power of, for example, 8 kW.

Figure 4:
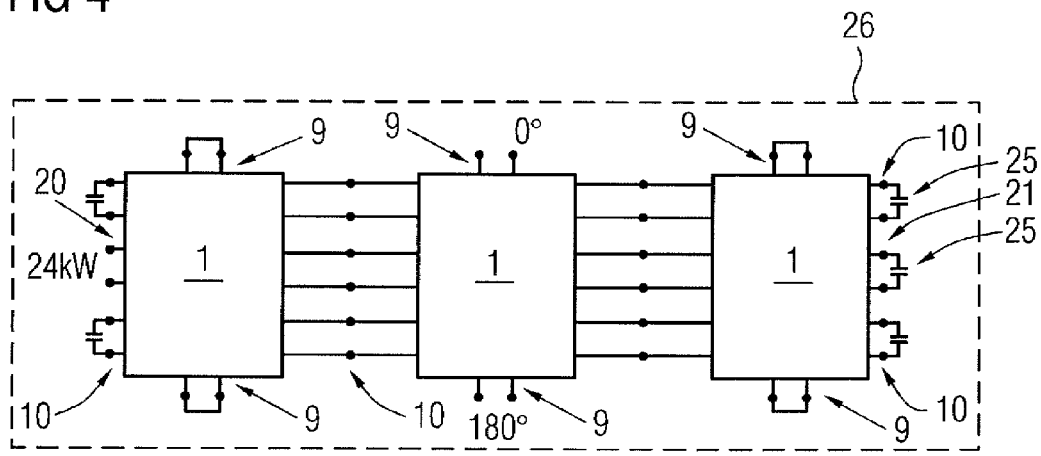
FIG. 4 shows a cascaded application with three output stage modules in one embodiment of a power amplifier device.

FIG. 4 shows the cascaded use of three output stage modules 1 in one embodiment of a power amplifier 26. The connections 9 of the two outer output stage modules 1 are short-circuited. Only at the center output stage module I are the control signals input with 0° and 180°. The output stage modules are coupled to each other via the pairs of connections 10, 20 and 21, while external capacitors 25 for tuning are used at the outer output stage modules. Three times the output power may be obtained with this circuit (e.g., 24 kW).

Figure 5:
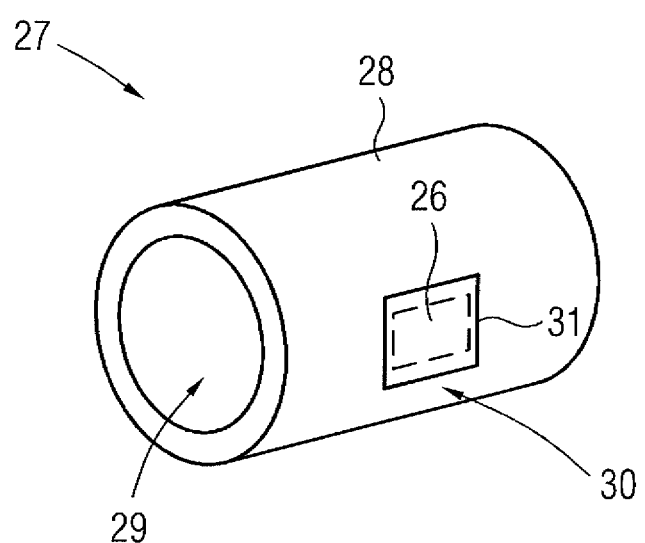
FIG. 5 shows one embodiment of a magnetic resonance device.

FIG. 5 shows one embodiment of a magnetic resonance device 27. The magnetic resonance device 27 includes a main magnet unit 28 including coils for generating the main magnetic field with a patient chamber 29. A transmit unit 30 with a housing 31, which contains one embodiment of the power amplifier device 26, is arranged on the outside of the main magnet unit 28.

Components of the magnetic resonance device 27 are widely known in the prior art and are not explained any further here.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. An output stage module for a power amplifier device, the output stage module comprising:
    a housing;
    a carrier arranged within the housing, the carrier being made from a non-electrically-conducting, thermally-conducting material;
    at least two transistor dies arranged on the carrier;
    a first conductor structure in or on the carrier, the first conductor structure connecting drain outputs of the at least two transistor dies to an output signal; and
    at least two second conductor structures in or on the carrier, each second conductor structure conducting an input signal to at least one gate input of the at least two transistor dies,
    wherein at least one transistor die of the at least two transistor dies, in each case, is assigned to a phase of a symmetrical input signal, and
    wherein at least one cooling channel routed adjacent to the at least one transistor die is provided within the carrier.

2. The output stage module as claimed in claim 1, wherein the at least two second conductor structures each comprise a balun conductor structure, the at least second two conductor structures generating signals phase-opposed by 180° as input signals for the at least two transistor dies.

3. The output stage module as claimed in claim 1, wherein at least one conductor structure of the first conductor structure and the at least two second conductor structures comprises a multilayer conductor structure, and
    wherein at least one layer including a conductor track is provided within the carrier.

4. The output stage module as claimed in claim 1, wherein the first conductor structure and the at least two second conductor structures are inductively-acting conductor structures, and
    wherein at least one pair of connections is provided for connecting an external capacitor to set a resonant frequency of a conductor loop of each of the first conductor structure and the at least two second conductor structures.

5. The output stage module as claimed in 4, wherein the at least two second conductor structures each comprise a balun conductor structure, and
    wherein with a central coupling-in of a control signal, two pairs of connections opposite one another are provided for connecting two of the external capacitors.

6. The output stage module as claimed in claim 1, wherein on an outer side of the carrier, at least one source conductor structure couples to ground, and
    wherein source inputs of the at least two transistor dies are connected to the at least one source conductor structure.

7. The output stage module as claimed in claim 6, wherein with source inputs of the at least two transistor dies provided on one side of a conductor surface of the first conductor structure connected to a drain output, a bridge-type conductor element of the source conductor structure is provided for contacting the source inputs.

8. The output stage module as claimed in claim 1, wherein the carrier is equipped on both sides with transistor dies.

9. The output stage module as claimed in claim 1, wherein each of the at least two transistor dies is soldered with a drain output to a part of a conductor surface of the carrier, forming the first conductor structure, and wherein a gate output of each of the at least two transistor dies is wire-bonded to a corresponding second conductor structure of the at least two second conductor structures.

10. The output stage module as claimed in claim 1, wherein the at least two transistor dies comprise at least eight transistor dies,
wherein the at least eight transistor dies are provided on at least one side of the carrier, and
wherein two transistor dies of a phase of the at least eight transistor dies are coupled via a conductor surface of the carrier to two transistor dies of another phase of the at least eight transistor dies.

11. The output stage module as claimed in claim 1, wherein an inner side of the housing has a conductor surface acting as a ground surface, and
wherein the carrier does not include a ground surface.

12. The output stage module as claimed in claim 1, wherein the at least one cooling channel corresponds in width and position to that of the at least one adjacent transistor die.

13. The output stage module as claimed in claim 1, wherein the carrier is comprised of aluminum oxide ceramic, aluminum nitride ceramic, or a combination thereof.

14. The output stage module as claimed in claim 1, wherein the output stage module is for a power amplifier device of a transmit unit of a magnetic resonance device.

15. The output stage module as claimed in claim 1, wherein the carrier is made from ceramic.

16. The output stage module as claimed in claim 1, wherein the first conductor structure in or on the carrier inductively connects the drain outputs of the at least two transistor dies to the output signal.

17. The output stage module as claimed in claim 6, wherein the source inputs of the at least two transistor dies are wire-bonded to the at least one source conductor structure, a conductor surface connected to at least one drain output of a transistor die of the at least two transistor dies has a connection at a central point for an operating voltage and is connected to ground via a capacitance, or a combination thereof.

18. The output stage module as claimed in claim 7, wherein the bridge-type conductor element of the source conductor structure is a bridge comprising Kovar.

19. The output stage module as claimed in claim 8, wherein the carrier has an outer structure that is the same on both sides.

20. The output stage module as claimed in claim 10, wherein the at least eight transistor dies are provided on both sides of the carrier.

21. The output stage module as claimed in claim 11, wherein the conductor surface is a metallization.

22. The output stage module as claimed in claim 1, wherein the non-electrically-conducting, thermally-conducting material of the carrier comprises a low electrical loss material.

23. A power amplifier device comprising:
an output stage module comprising:
a housing;
a carrier arranged within the housing, the carrier being made from a non-electrically-conducting, thermally-conducting material;
at least two transistor dies arranged on the carrier;
a first conductor structure in or on the carrier, the first conductor structure connecting drain outputs of the at least two transistor dies to an output signal; and
at least two second conductor structures in or on the carrier, each second conductor structure conducting an input signal to at least one gate input of the at least two transistor dies,
wherein at least one transistor die of the at least two transistor dies, in each case, is assigned to a phase of a symmetrical input signal, and
wherein at least one cooling channel routed adjacent to the at least one transistor die is provided within the carrier.

24. A magnetic resonance device comprising:
at least one transmit unit comprising a power amplifier device including:
an output stage module comprising:
a housing;
a carrier arranged within the housing, the carrier being made from a non-electrically-conducting, thermally-conducting material;
at least two transistor dies arranged on the carrier;
a first conductor structure in or on the carrier, the first conductor structure connecting drain outputs of the at least two transistor dies to an output signal; and
at least two second conductor structures in or on the carrier, each second conductor structure conducting an input signal to at least one gate input of the at least two transistor dies,
wherein at least one transistor die of the at least two transistor dies, in each case, is assigned to a phase of a symmetrical input signal, and
wherein at least one cooling channel routed adjacent to the at least one transistor die is provided within the carrier.

25. An output stage module for a power amplifier device of a transmit unit of a magnetic resonance device, the output stage module comprising:
a housing; and
a carrier arranged within the housing made from a non-electrically-conducting, thermally-conducting material with a low electrical losses, with at least two transistor dies arranged thereon, wherein at least one transistor in each case is assigned to a phase of the symmetrical input signal, as well as in and/or on the carrier a first conductor structure inductively connecting the drain outputs of the transistor dies to an output signal and two second conductor structures in or on the carrier, each second conductor structure an input signal to at least one gate input of the transistor dies are provided, wherein within the carrier, at least one cooling channel routed adjacent to the at least one transistor die is provided.

* * * * *